(12) United States Patent
Graessner

(10) Patent No.: US 10,976,394 B2
(45) Date of Patent: Apr. 13, 2021

(54) METHOD AND APPARATUS FOR PRODUCING ANGIOGRAPHIC MAGNETIC RESONANCE IMAGES

(71) Applicant: Siemens Healthcare GmbH, Erlangen (DE)

(72) Inventor: Joachim Graessner, Boenningstedt (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/445,585

(22) Filed: Jun. 19, 2019

(65) Prior Publication Data
US 2019/0383893 A1    Dec. 19, 2019

(30) Foreign Application Priority Data
Jun. 19, 2018    (EP) .................................... 8178531

(51) Int. Cl.
*G01R 33/483* (2006.01)
*G01R 33/563* (2006.01)
*G01R 33/56* (2006.01)

(52) U.S. Cl.
CPC ..... *G01R 33/4835* (2013.01); *G01R 33/5608* (2013.01); *G01R 33/5635* (2013.01)

(58) Field of Classification Search
CPC ............ G01R 33/4833; G01R 33/4835; G01R 33/5608; G01R 33/5635; G01R 33/5673; G01R 33/385; G01R 33/54; A61B 5/055
See application file for complete search history.

(56) References Cited

U.S. PATENT DOCUMENTS

| | | |
|---|---|---|
| 5,755,666 A | 5/1998 | Bornert et al. |
| 6,249,694 B1 | 6/2001 | Foo et al. |
| 2012/0016224 A1 | 1/2012 | Schmitt |
| 2012/0249139 A1 | 10/2012 | Kopanoglu et al. |
| 2012/0262171 A1 | 10/2012 | Weber et al. |
| 2018/0081017 A1* | 3/2018 | Edelman ............ G01R 33/5635 |

OTHER PUBLICATIONS

Börnert, Peter et al. "Curved Slice Imaging" Magnetic Resonance in Medicine, vol. 36, No. 6, pp. 932-939, Dec. 1996 // https://doi.org/10.1002/mrm.1910360616.
Wagner, Moritz et al. "Nonenhanced peripheral MR-angiography (MRA) at 3 Tesla: evaluation of quiescent-interval single-shot MRA in patients undergoing digital subtraction angiography" The International Journal of Cardiovascular Imaging, vol. 31, No. 4, pp. 841-850, 2015 // DOI: 10.1007/s10554-015-0612-3.
Weber, Hans "Magnetic Resonance Imaging with Customized Slice Shapes using Non-Linear Encoding Fields" Dissertation, Uni Freiburg, Feb. 2014.

* cited by examiner

*Primary Examiner* — Rishi R Patel
(74) *Attorney, Agent, or Firm* — Schiff Hardin LLP

(57) ABSTRACT

A method and apparatus produce angiographic magnetic resonance (MR) images that are based on unsaturated spins flowing into an imaging volume, wherein vessels of the person under examination that do not run parallel to a coordinate axis of the MR apparatus are imaged. The nuclear magnetization in at least a first imaging slice of the person under examination is excited in order to generate MR signals in at least one imaging slice, and MR signals from the at least one first imaging slice are received in order to produce angiographic MR images of the vessels. The at least imaging slice has a curved slice profile.

17 Claims, 5 Drawing Sheets

METHOD AND APPARATUS FOR PRODUCING ANGIOGRAPHIC MAGNETIC RESONANCE IMAGES

BACKGROUND OF THE INVENTION

Field of the Invention

The present invention concerns a method for producing angiographic magnetic resonance (MR) images that are based on unsaturated nuclear spins flowing into an imaging volume. The invention also concerns an MR apparatus and a non-transitory electronically readable data storage medium that implement such a method.

Description of the Prior Art

Inflow-based MR angiography (MRA) uses the sensitivity of the MR signal to the motion of nuclear spins in order to produce images of vessels, in particular of arteries and occasionally of veins. For visualizing peripheral blood vessels, in particular blood vessels in the pelvis-leg outflow path or in the arm-hand segment, as well as blood vessels in other body regions, non-contrast (NC) methods of magnetic resonance imaging (MRI) are used which, by means of transverse data acquisition with and without ECG triggering, exploit the inflow of fresh, unsaturated blood for hyperintense visualization of the vessels.

By shifting the position of the measured imaging slices discretely or continuously, in some cases also with an overlap, a larger region is acquired in its entirety before this process is restarted by moving the table position. Such methods based on unsaturated spins flowing into an imaging volume are known synonymously as inflow-based MR imaging methods or time-of-flight (TOF) techniques. A method that has become particularly important in recent years is the QISS (quiescent interval single shot) method, an ECG-triggered MRA method without administration of contrast agent, in which the image acquisition is synchronized with the cardiac signal from the patient. In this method, the signal intensity of the stationary tissue within an acquisition slice that is transverse to a coordinate axis of the MR system is first reduced by a non-selective RF saturation pulse. This magnetization preparation follows an interval known as the quiescent interval (QI), during which no RF pulse excitation takes places. The QI ideally lies at the moment of maximum systolic blood flow in the readout slice. The actual image acquisition takes place during the diastole, when blood flow is slow. The QISS method is described, for example, in the document "Nonenhanced peripheral MR-angiography (MRA) at 3 Tesla: evaluation of quiescent-interval single-shot MRA in patients undergoing digital subtraction angiography", by Moritz Wagner et al. in The International Journal of Cardiovascular Imaging 31.4 (2015): 841-850.

Conventional inflow-based MR angiography methods, however, are prone to errors at anatomic positions at which blood vessels do not run orthogonal to a transverse imaging slice, i.e. do not run parallel to a coordinate axis of the MR system. If the vessels change their path in relation to the transverse acquisition slice from an orthogonal path to a lateral path, then they run, at least in part, parallel to the imaging slice. This means that, at these anatomic positions there will be less efficient filling of the vessel segment with unsaturated inflowing spins, resulting in hypointense to non-existent visualization of the vessel segment. This can lead to misdiagnoses or acquisitions that are not suitable for diagnosis, for instance in which it is not possible to identify vascular occlusions. These phenomena are also called in-plane flow artifacts.

The trifurcation below the knee is particularly susceptible to this effect, as is the bifurcation in the pelvic region. It has not been possible to use conventional inflow techniques to visualize the renal arteries, which have nearly 90-degree vascular outflows. The only way to minimize these in-plane flow artifacts hitherto lay in reducing the slice thickness, or in an additional, more orthogonal measurement of the region of interest, or extending the TR time, i.e. the inflow time, each case resulting in a longer measurement time, and in the case of the thinner slice thickness, also having the disadvantage of a lower signal-to-noise ratio (SNR). Accordingly, because of the described disadvantages of the conventional MR techniques in the critical regions, it is often necessary to perform additional high-resolution scans having thinner slice thicknesses, for instance using the high-resolution thin slice protocol, which involves more time and personnel effort and hence higher examination costs. Manual labeling of the critical regions and performing additional high-resolution scans is a time-consuming and difficult procedure, which can be performed only by trained operators.

Therefore there is a need for an improved method for producing angiographic MR images based on the effect of unsaturated spins flowing into an imaging volume, which method can image, reliably and without errors, vessels of a person under examination in an MR system that do not run parallel to a coordinate axis of the MR system.

SUMMARY OF THE INVENTION

An object of the present invention is to provide a method and apparatus that avoid, or at least alleviate the above-described problems associated with producing angiographic MR images under the conditions described above.

According to a first aspect of the invention, a method is provided for producing angiographic MR images that are based on unsaturated spins flowing into an imaging volume. In this context, vessels to be visualized, or at least vessel segments of vessels to be visualized, of a person under examination who is located in an MR system for the examination do not run parallel to a coordinate axis of the MR system, in particular to a Z-coordinate axis of the MR system. Some vessel segments may run orthogonal, or substantially orthogonal, to the coordinate axis of the MR system. Those skilled in the art that the use of the term "orthogonal" does not require the path of the vessel segments to be exactly orthogonal, but instead this term encompasses any path that has an orthogonal component that is large enough so that in-plane flow artifacts may occur.

In a first step of the inventive method, the magnetization of nuclear spins in at least one imaging slice of the person under examination is excited in order to generate MR signals. The at least one imaging slice includes at least a portion of the vessels that are to be visualized by the imaging method. The imaging slice thus also includes those vessel segments that do not run parallel to a coordinate axis of the MR system, in particular those vessel segments that run orthogonal to the coordinate axis of the MR system. In a further step, the MR signals from the at least one imaging slice are received in order to produce angiographic MR images of the vessels.

The at least one imaging slice has a curved slice profile. In other words, the at least one imaging slice has surfaces that are curved with respect to the coordinate axis of the MR system.

Those vessel segments having a path that has a large component orthogonal to the coordinate axis run in conventional planar transverse imaging slices with a corresponding large component parallel to the imaging slice. Thus within the imaging slice they run in part parallel to the imaging slice, or within the imaging slice extend over a region that is wider compared with orthogonal vessels, thereby fostering in-plane flow artifacts.

By virtue of the curved slice profile, i.e. the curvature, of the imaging slice according to the invention in inflow-based MR angiography methods, vessel segments having a path that is not parallel to the coordinate axis run more perpendicular, i.e. with a higher orthogonal flow component, to the imaging slice having a curved slice profile. In an extreme case, vessel segments that run perpendicular to the coordinate axis (and in conventional inflow methods run entirely parallel to, and within, the transverse imaging slice) intersect the imaging slice according to the invention at a steep angle, so that in-plane flow artifacts can be avoided. It is hence possible to dispense with manual labeling of such critical regions and performing additional high-resolution scans. In other words, the optimized excitation profiles of the imaging slice can save measurement time and increase the reliability of the angiographic visualization, because curved slice profiles allow blood inflow that is more orthogonal and hence facilitate a higher signal.

This provides an improved method for producing inflow-based angiographic MR images, which shows, reliably and without errors, vessel segments of a person under examination that do not run parallel to a coordinate axis of an MR system. The method requires less time and personnel effort, and can hence be performed at lower examination costs.

The nuclear magnetization in the at least one imaging slice can be excited by a linear gradient system of the MR system. The linear gradient system may be a standard gradient system having strongly linear gradient fields in all three spatial directions and having 1-channel, 2-channel or multichannel radio-frequency excitation, which are used in combination to excite the nuclear spins. By using the linear gradient system to excite the nuclear spins, it is possible to implement an imaging slice of any shape, for instance having a uniform slice thickness, without needing to take account of any non-linear characteristics of a conventional RF transmit coil.

The curved slice profile may be a slice profile from a parabolic, hyperbolic, V-shaped or arrow-shaped slice profile. The curved slice profile may be symmetric about the coordinate axis of the MR system. The curved slice profile may be mirror-symmetric about a plane comprising the coordinate axis of the MR system. In the center of the imaging slice, i.e. with respect to the lateral direction or close to the coordinate axis, the curved slice profile can run orthogonal to the coordinate axis of the MR system.

The aforementioned embodiments of the imaging slice can achieve a gentle transition from planar transverse imaging slices to the imaging slice according to the invention. In addition, a number of imaging slices corresponding to these shapes can be concatenated easily in the direction of the coordinate axis, allowing good imaging of a vessel that, in the center of the imaging slices, runs parallel to the coordinate axis. Slice profiles having a parabolic curvature allow a more orthogonal inflow of the blood and hence a higher signal in the peripheral region of imaging slices shaped in this manner.

The slice profile can also be characterized by a lateral angle, which is the angle that includes the lateral course of the curved slice profile and the coordinate axis of the MR system.

The coordinate axis on one side, and an axis that borders the imaging slice in the outer region, can define the lateral angle. The lateral angle can equal 30 to 60 degrees, in particular 45 degrees, whereby bifurcations in the knee, arm-hand and pelvis can be visualized effectively. The lateral angle can equal in particular 30 degrees, whereby vessels branching at 90 degrees to the coordinate axis, for instance the branching renal arteries, can be visualized particularly accurately.

In an embodiment, the curved slice profile may be employed only in manually labeled regions of the person under examination. Using a conventional profile in other examination regions improves the quality of the angiographic images by virtue of using the appropriate slice characteristic, adapted to suit the given vessel paths, for high image quality.

In an embodiment, the curved slice profile may be employed only in regions of the person under examination that have been labeled automatically using tables containing empirical patient data.

Empirical patient data can describe an average patient, and in particular can assign the position of specific regions or organs, for example of the kidneys, backs of the knees, or of the pelvis, to specific body-height segments. A table, in particular a look-up table, can contain the empirical patient data. Automatic labeling using empirical patient data can dispense with manual labeling of critical examination regions, which is prone to errors because a user must decide, for instance, whether an image error, artifacts or a reliable examination result, for instance a vascular occlusion, exists. Using tables, in particular look-up tables, speeds up the automatic labeling. This can achieve a faster examination time and a higher image quality without a user having to make additional entries when operating the MR system.

Empirical patient data can be used to optimize the curved slice profile, in particular the lateral angle. Defining an appropriate slice profile by a user of the MR system is prone to errors and hence cannot always guarantee a good measurement result. In particular, those lateral angles that are optimum for good image results for different regions can be retrieved from tables containing empirical patient data, without an operator having to make additional entries while operating the MR system. There is no need for any further interaction by the user, for instance making requests or confirmations at a user interface of the MR system, whereby time can be saved in the examination time.

Exciting the nuclear magnetization in at least one imaging slice can involve exciting the nuclear magnetization in a first imaging slice and in an additional, second imaging slice, which likewise has a curved slice profile. The first imaging slice and the second imaging slice can overlap partially. The first imaging slice and the second imaging slice can have different slice profiles or the same slice profiles.

A higher image quality and faster examination time is achieved by using a number of imaging slices arranged one after the other or with at least a partial overlap. When the imaging slices have different curvatures, these can complement one another in the sense that details that cannot be resolved by the first imaging slice can be visualized using the second imaging slice.

In addition, planar transverse slice profiles can be employed outside the above-mentioned labeled regions, and the slice profiles curved according to the invention can be employed inside the labeled regions. In this case, the transition of the slice profiles can be made continuously, or incrementally in small steps from slice to slice. This achieves improved image quality without additional effort on the part of the user and without additional high-resolution measurement sequences having to be carried out in the specified labeled regions.

In order to produce angiographic MR images, the method according to the invention can be performed on the basis of the quiescent interval single shot (QISS) method, thereby significantly increasing the robustness and quality of this method in terms of in-plane flow artifacts.

According to another aspect of the invention, an MR apparatus is provided, which is designed to produce angiographic MR images that are based on unsaturated spins flowing into an imaging slice, in particular an MR system for inflow-based MR angiography. In this context, vessel segments of a person under examination in the MR system do not run parallel to a coordinate axis of the MR system. The MR apparatus has a MR scanner operated by a control computer with a memory, wherein the memory stores control information that can be executed by the control computer.

In the MR apparatus according to the invention, the control computer is configured to operate the MR scanner in order to excite nuclear magnetization in at least one imaging slice of the person under examination, wherein the at least one first imaging slice has a curved slice profile, so as to thereby to generate MR signals. The MR signals from the at least one imaging slice are received in order to produce angiographic MR images of the vessels therein.

The MR system for vascular visualization thus is designed so as to perform the method in accordance with the features described above, when the control information is executed in the MR control computer. The MR system can include a linear gradient system for exciting the nuclear magnetization. The linear gradient system, in all three spatial directions, produces strongly linear gradient fields by the activation of gradient coils, which are used in combination with 1-channel, 2-channel or multichannel radio-frequency excitation.

The present invention also encompasses a non-transitory, computer-readable data storage medium encoded with programming instructions that, when the storage medium is loaded into a control computer of an magnetic resonance apparatus, cause the control computer to operate the magnetic resonance apparatus so as to implement any or all embodiments of the method according to the invention, as described above.

Technical effects achieved by the MR apparatus and the electronic data storage medium are comparable to the technical effects that were described above for the method according to the first aspect of the invention.

The features presented above and features described below can be used not only in the explicitly presented combinations, but also in other combinations, or in isolation, without departing from the scope of the present invention.

DESCRIPTION OF THE PREFERRED EMBODIMENTS

Figure 1:
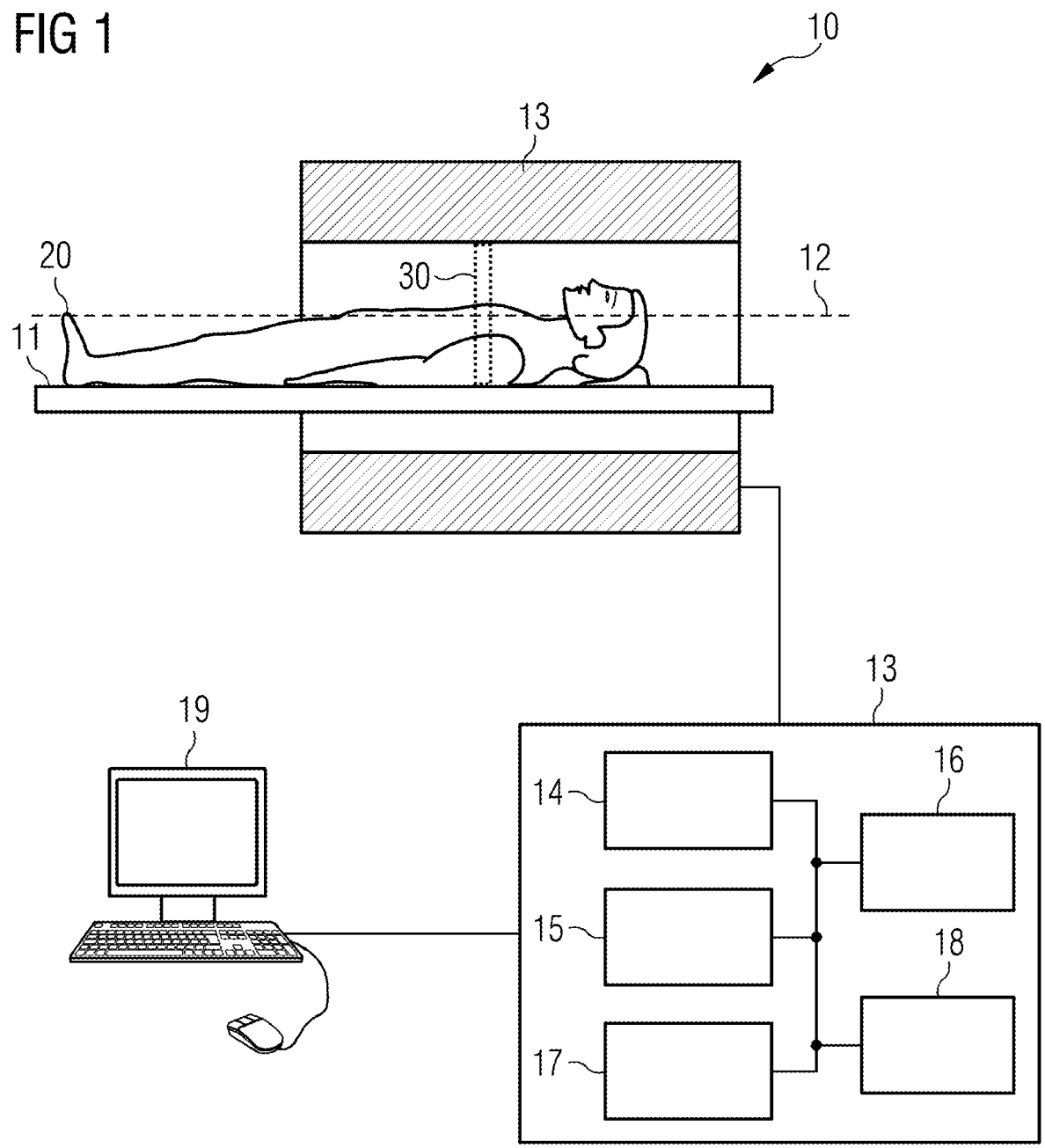
FIG. 1 schematically illustrates an MR apparatus that is operable so as to perform the method according to the invention for producing angiographic MR images that are based on unsaturated spins flowing into an imaging volume.

The present invention relates to a method for vascular visualization using an MR system, in which angiographic MR images are produced that are based on unsaturated spins flowing into an imaging volume. In vessel visualization based on unsaturated spins flowing into an imaging volume, stationary magnetization, which generates an unwanted background signal in an imaging slice, is saturated by an RF pulse. The RF pulse and the applied magnetic field are designed to suppress the background signals without exciting the spins of the vascular fluid that are flowing into the imaging volume.

Within the meaning of the present disclosure, methods for producing angiographic MR images that are based on unsaturated spins flowing into an imaging volume are inflow-based MR imaging methods, also known as time-of-flight (TOF) techniques, or inflow techniques. The method according to the invention relates in particular to the QISS (quiescent interval single shot) method, also to MR angiography, in particular to non-contrast MR angiography methods.

Within the meaning of the present disclosure, the terms imaging slice, imaging volume, acquisition slice and slice are used synonymously, and describe a volume of the person under examination in the MR system, in which volume spins are excited in order to generate MR image data, and from which volume, MR signals are measured in order to generate an MR image, which visualizes the corresponding imaging volume.

Within the meaning of the present disclosure, the term slice profile describes the 3-dimensional geometric shape of an imaging slice. A slice profile is curved if the surfaces bordering the imaging slice are not planar transverse faces but are curved towards or away from the coordinate axis. A front surface of the imaging slice, which constitutes a first bounding surface of the imaging slice in the direction of the coordinate axis, and a rear surface of the imaging slice, which constitutes a second bounding surface of the imaging slice in the direction of the coordinate axis, are not planar, flat faces but curved or domed faces. In particular, both can be curved in the same direction, both towards and away from the coordinate axis. The imaging slice can hence have a uniform slice thickness if both surfaces have the same curvatures, or have a variable slice thickness if the surfaces, although curved in the same direction, have different curvatures.

Within the meaning of the present disclosure, empirical patient data are obtained from a multiplicity of patients and thus represents average or statistical values of patients, i.e. of an average patient. Based on a small number of characteristics, for instance gender, age or height, the empirical patient data specifies the position of specific organs or regions to be examined in relation to segments of the body of the average patient. The data may be in the form of tables, so that the spatial position of an examination region in relation to a person under examination can be defined without additional calculations.

Within the meaning of the present disclosure, the term coordinate axis of the MR system includes in particular a main coordinate axis of the MR system, with respect to which, conventionally transverse flat imaging slices in the x-y plane are excited, and which is also known as the patient axis, z-axis, axis of movement of the patient table or longitudinal axis of the (patient) tunnel.

FIG. 1 shows schematically an MR apparatus 10, which is operable so as to perform the method according to the invention for producing angiographic MR images that are based on unsaturated spins flowing into an imaging volume.

A person under examination 20 has been moved into the tunnel of the scanner 13 of the MR apparatus 10. The MR scanner 13 has a basic field magnet that generates a basic field B0. The person 20 under examination arranged on a bed 11 and is moved along a coordinate axis 12 of the MR apparatus 10 into the center of the scanner 13 in order to acquire, from a segment under examination, spatially encoded magnetic resonance signals. The application of radio-frequency pulses and switching of magnetic field gradients disrupts the magnetization produced by the basic field B0 by deflecting the nuclear spins out of the equilibrium position, and the currents induced in receive coils during the return to the equilibrium position are converted into magnetic resonance signals. Those skilled in the art know in general how MR images are produced by inflow-based MR angiography methods, and how the MR signals are detected, so this need not be explained in greater detail herein.

As preparation for MR angiography measurements, images known as localizer images are generated of the person 20 under examination and of the vessels 21. The localizer images can be generated, for example, using sagittal, coronal or transverse flow-sensitive steady-state imaging sequences.

The magnetic resonance apparatus 10 also has an MR control computer 13, which controls the overall MR apparatus 10. The central MR control computer 13, which is designed such that it performs the methods described below for producing inflow-based angiographic MR images, includes a gradient controller 14 for controlling and switching the magnetic field gradients, and an RF controller 15 for controlling and emitting the RF pulses for deflecting the nuclear spins from the equilibrium position. The imaging sequences needed for acquiring the MR images and all the programs needed to operate the MR system, for example, can be stored in a memory 16. An acquisition unit 17 controls the image acquisition and thus controls, on the basis of the selected imaging sequences, the sequence of the magnetic field gradients and RF pulses and the intervals for receiving MR signals. Therefore the acquisition unit 17 also controls the gradient controller 14 and the RF controller 15. MR images, which can be displayed on a display 19, can be computed in a reconstruction processor 18. An operator can operate the MR system via a console terminal 19. The memory 16 can contain imaging sequences and program modules that, when executed by the computer 13, cause the inflow-based angiographic method according to the invention to be performed. The RF controller 15 is designed to improve the production of inflow-based angiographic images by the use of curved imaging slices, as explained in detail below. The memory 16 stores for this purpose, control information (code) that can be executed by the MR control computer 13. In addition, the acquisition unit 17 is designed to be able to perform the method for vascular visualization described below.

According to the invention, the MR apparatus 10 of FIG. 1 is designed such that when the control information is executed in the MR control computer 13, in a first step, the nuclear magnetization in at least one imaging slice 30 of the person 20 under examination is excited in order to generate MR signals. The at least one imaging slice 30 contains at least a portion of the vessels 21 that are to be visualized by the imaging method. The imaging slice 30 thus also includes those vessel segments 22 of the vessels 21 that do not run parallel to a coordinate axis 12 of the MR apparatus 10. In an exemplary embodiment, the imaging slice 30 also includes those vessel segments that have a path having a large orthogonal component with respect to the coordinate axis 12 of the MR system.

In a further step, the MR signals from the at least one first imaging slice 30 are received in order to produce inflow-based angiographic MR images of the vessels 21. The MR system is designed such that the at least one imaging slice 30 has a curved slice profile 31.

The MR apparatus 10 can have, for exciting the nuclear magnetization, a linear gradient system, which has, in all three spatial directions, strongly linear gradient fields produced by gradient coils, which can be used in combination with 1-channel, 2-channel or multichannel radio-frequency excitation to excite the nuclear spins using curved slice profiles. The MR apparatus 10 can be designed to perform the quiescent interval single shot (QISS) method.

Figure 2:
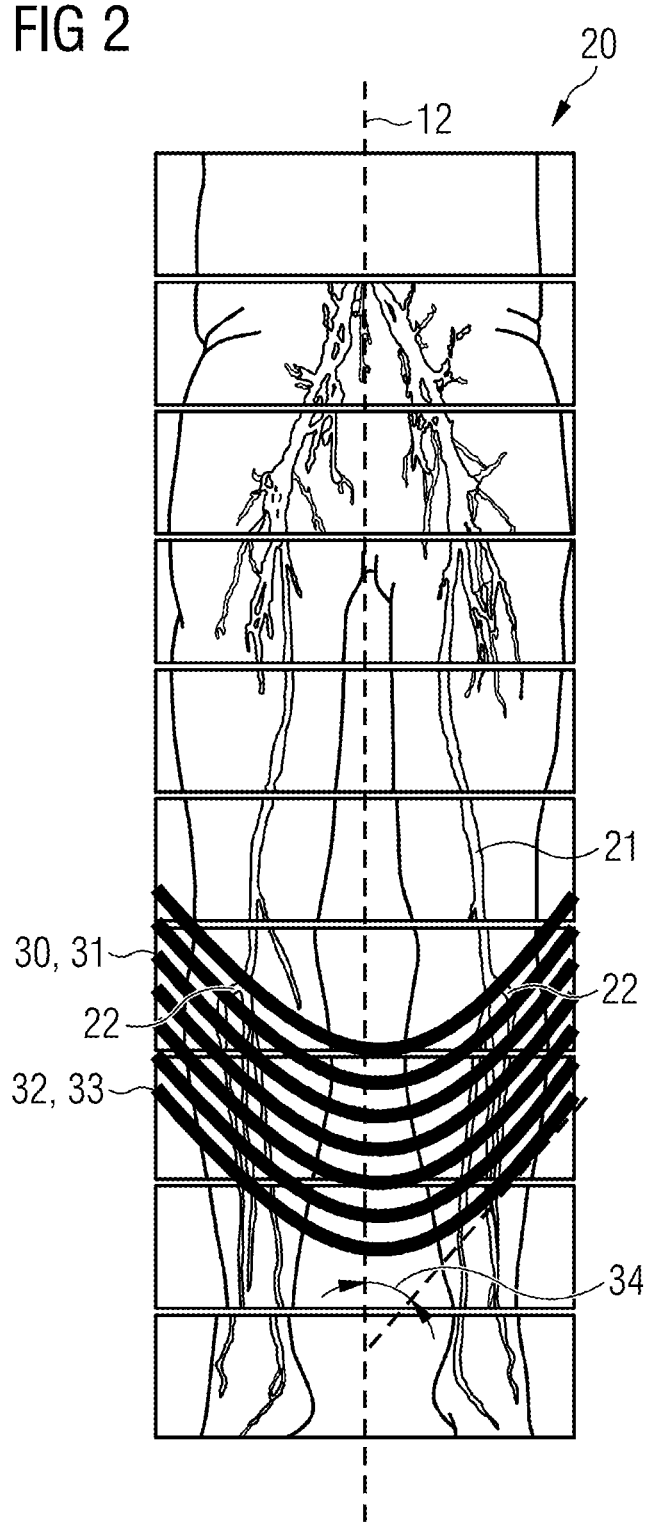
FIG. 2 is a schematic diagram of a localizer image of a person under examination having curved slice profiles according to exemplary embodiments of the invention.

FIG. 2 is a schematic diagram of a localizer image of a person 20 under examination having curved slice profiles 31 according to exemplary embodiments of the invention.

FIG. 2 shows the lower half of the body of a person 20 under examination. The coordinate axis 12 of the MR apparatus 10 extends along the longitudinal axis of the body, or patient axis, of the person 20 under examination. Inside the person 20 under examination, blood vessels 21 are depicted light. The blood vessels 21 shown run mainly along the coordinate axis 12 of the MR apparatus 10. In some critical regions, for instance in the trifurcation of the knee of the person 20 under examination, vessel segments 22 run orthogonal to the coordinate axis 12, or with a large orthogonal directional component with respect to the coordinate axis. Thus blood inside the vessel segments 22 flows in a direction orthogonal to the coordinate axis 12, in other words at a steep angle with respect to the coordinate axis 12.

FIG. 2 also shows imaging slices 30 having curved slice profiles 31, which are used in the inflow-based MR imaging according to the invention. In the exemplary embodiment, the imaging slices 30 have a parabolic slice profile 31. In the region of the knee of the person 20 under examination, the parabolic slice profile 31 runs at a lateral angle 34 in the range of 30 to 60 degrees, and in the center, perpendicular to the coordinate axis 12. Thus in the region of the trifurcation, an orthogonal inflow for the vessel segments 22 occurs over a limited distance, while the other vessels still generate little in-plane flow.

Slice profiles 31 having other shapes are also possible, for instance hyperbolic, V-shaped or arrow-shaped slice profiles 31. These may have different symmetries, for instance axial symmetry about the coordinate axis 12 of the MR apparatus 10, or mirror symmetry about a plane comprising the coordinate axis 12. The coordinate axis and an axis lying along the lateral course of the slice profile 31 can include a lateral angle 34. This lateral angle 34 characterizes the imaging slices 31 in the outer region of the imaging slice 30, i.e. away from the coordinate axis. Shallow lateral angles 34 are advantageous for vessel segments 22 that branch at right angles. The lateral angle 34 can also be defined such that, according to the branching vessel segments 22, it allows the path of the vessel segments 22 to be as orthogonal as possible to the imaging slice 30. Empirical patient data can be used to optimize the lateral angle 34 for the curved slice profiles 31 for each imaging slice 30.

In addition, the region in which the curved slice profile 31 is employed can also be defined and labeled automatically by the MR apparatus 10. Angiographic imaging is hence performed automatically using an optimized slice profile 31, while automatically avoiding in-plane flow artifacts. For example, the empirical patient data can be used to define an angle in the range of 30 to 60 degrees, in particular 45 degrees, for an examination of the trifurcation of the knee. In this case, an operator of the MR apparatus 10 does not need to assess an angiographic image nor specify in any user interface of the MR apparatus 10 parameters for an additional, more precise examination, which means that large time savings can be made and better quality of the angiographic images can be achieved.

The position of the trifurcation of the knee of the person 20 under examination can be defined automatically using empirical patient data. For example, an operator of the MR apparatus 10 can specify the gender and height of the person 20 under examination, and the MR apparatus 10 can define automatically in which body-height segment of the person 20 under examination the trifurcation of the knee lies, and label this region automatically for employing the curved slice profiles 31. The automatic labeling can be performed particularly quickly if the empirical patient data is in the form of tables. Otherwise, the region of the trifurcation can also be labeled manually by the operator of the MR apparatus 10. Other examination regions are examined using conventional, planar imaging slices.

Alternatively, a smooth transition to this curved slice excitation profile 31 could be made at manually pre-labeled regions or at distances to automatically labeled segments, which distances are obtained by empirical tables, in order to optimize further the imaging of especially critical vessel segments 22.

As FIG. 2 also shows, in the angiographic examination of the trifurcation of the knee, according to the exemplary embodiment are visualized a first imaging slice 30 having a curved slice profile 31, a second imaging slice 32 having a curved slice profile 33, and further imaging slices. The imaging slices have the same shape in the exemplary embodiment. In order to provide particularly accurate imaging of the trifurcation, in another exemplary embodiment (not shown), the imaging slices can also have different curvatures. This can address the fact that vessel segments 22 can have different paths in the region of the different imaging slices. The imaging slices 30 may also partially overlap and may have different slice thicknesses.

Figure 3:
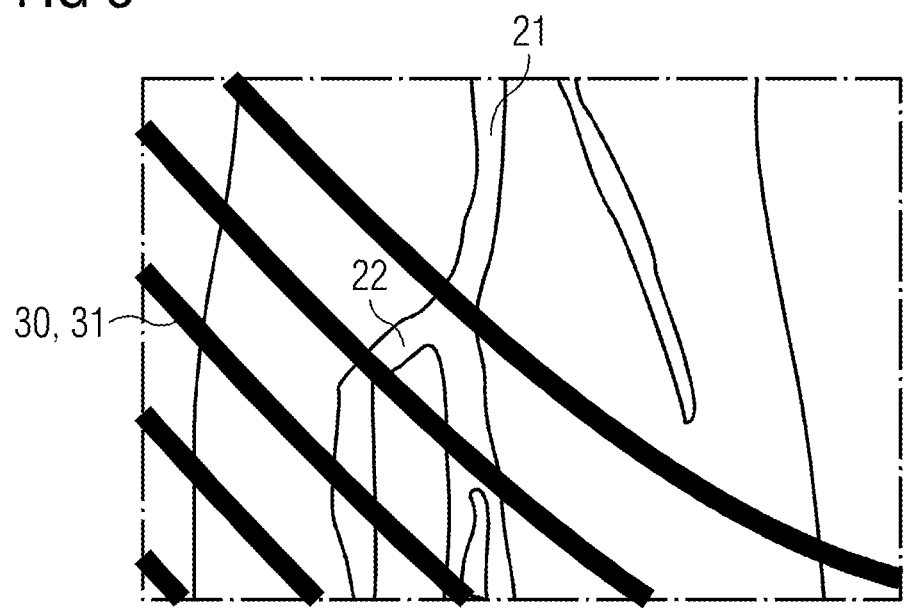
FIG. 3 shows schematically a detail from FIG. 2 in the region of the trifurcation of the knee of the person under examination according to exemplary embodiments of the invention.

FIG. 3 shows schematically a detail from FIG. 2 in the region of the trifurcation of the knee of the person 20 under examination according to exemplary embodiments of the invention.

It is evident from FIG. 3 that the vessel segments 22, which follow a high orthogonal path, do not run parallel to the imaging slices 30 according to the invention, but have a more perpendicular path with respect to the imaging slices 30. Thus in the vessel segments 22, blood flows with a small parallel component within the imaging slices 30, and with a high orthogonal component, i.e. at a steep angle into the imaging slices 30. Unsaturated spins are hence introduced into the imaging volume 30 more efficiently, so that in-plane flow artifacts can be avoided. Thus in this critical region of the trifurcation, employing profiles having a parabolic curvature for the slice excitation can make the blood inflow more orthogonal even for branching vessels 22, and hence generate a higher blood signal.

Figure 4:
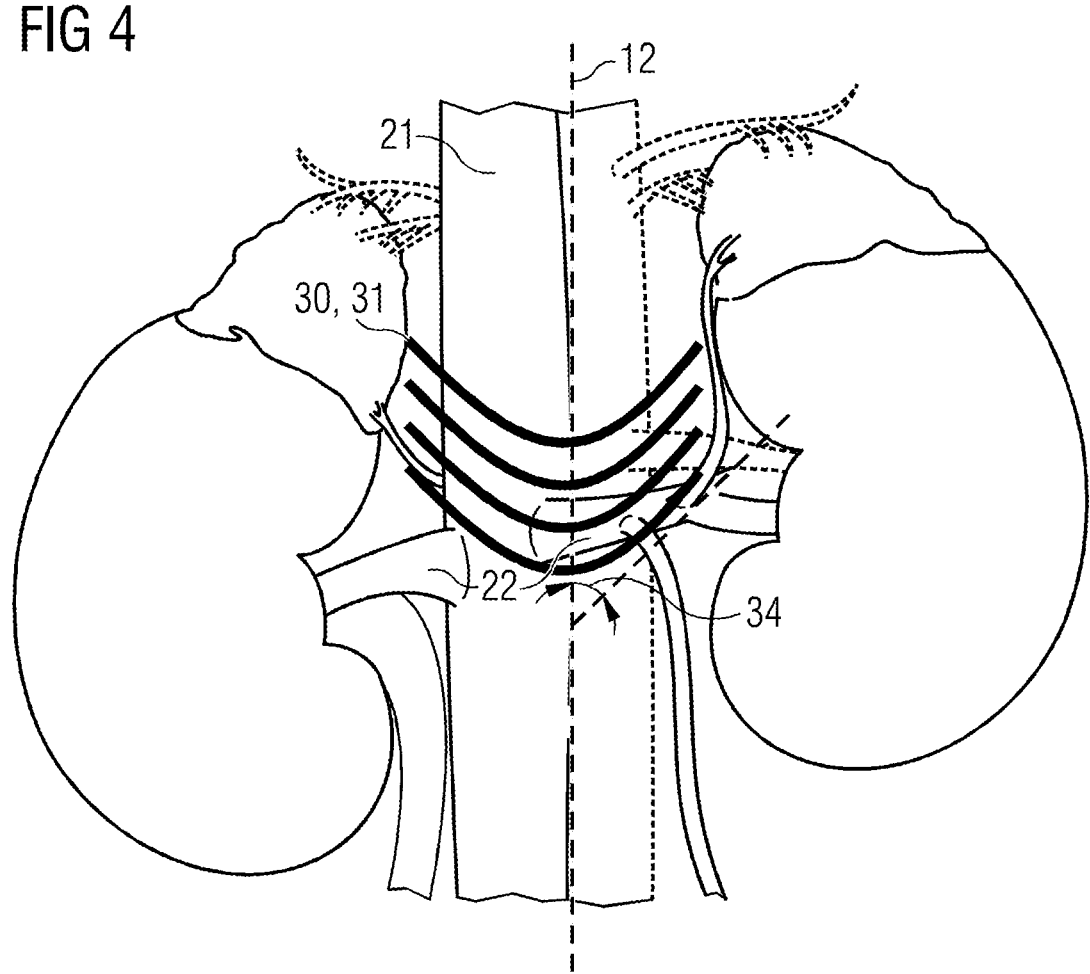
FIG. 4 is a schematic diagram of the kidney of a person under examination having curved slice profiles according to exemplary embodiments of the invention.

FIG. 4 shows a schematic diagram of the kidney of a person 20 under examination having curved slice profiles 31 according to exemplary embodiments of the invention.

FIG. 4 shows main arteries 21 running along the coordinate axis 12 of the MR apparatus 10, and also vessel segments 22 exiting to the left and right perpendicular to the blood vessels 21, which depict branching renal arteries. The imaging slices 30 additionally shown in FIG. 4 for inflow-based angiographic MR methods have curved slice profiles 31 that run in an arc shape. Hence they intersect at right angles the central arteries 21 running along the coordinate axis 12, but also the branching renal arteries 22 run at a steep angle to the outer course of the imaging slices 30. Thus both the central arteries 21 and the branching renal arteries 22 can be visualized by the curved slice profile 31 in an inflow-based MR imaging method without in-plane flow artifacts.

Alternatively, the slice can be tilted, i.e. transverse to coronal/sagittal, although this just shifts the problem of in-plane flow artifacts to vessels running along the coordinate axis 12. It is also possible to take more time and perform a plurality of measurements at different slice tilt in critical regions of the body, and then to merge these measurements in order to increase the blood signal at all the vessel segments 22.

Figure 5:
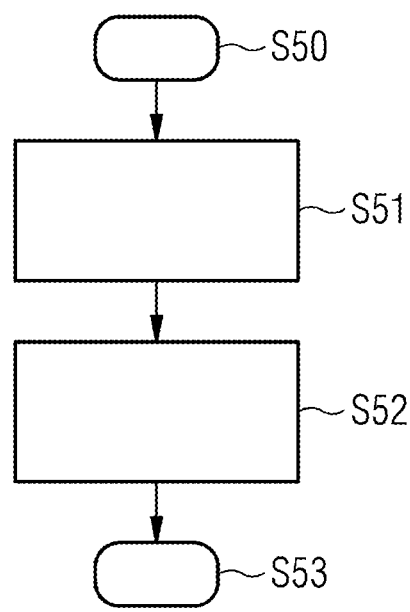
FIG. 5 is a flowchart of the basic steps for producing angiographic MR images that are based on unsaturated spins flowing into an imaging volume, according to exemplary embodiments of the invention.

FIG. 5 shows a flowchart of the basic steps for producing angiographic MR images that are based on unsaturated spins flowing into an imaging volume, according to exemplary embodiments of the invention.

The method starts in step S50. In step S51, the nuclear magnetization in at least one imaging slice of the person under examination is excited in order to generate MR signals. The at least one imaging slice includes the vessels that are to be visualized by the imaging method, in particular also vessel segments that do not run parallel to a coordinate axis of the MR system. In step S52, the MR signals from the at least one first imaging slice are received in order to produce angiographic MR images of the vessels. Said at least one first imaging slice has a curved slice profile. The method ends in step S53.

To summarize, an inflow-based angiographic MR imaging method is provided, wherein by use of curved slice profiles of the imaging slices it is possible to visualize also those vessel segments that do not run parallel to a coordinate axis of an MR system. The curved slice profiles can be applied automatically in accordance with empirical patient data in defined critical regions of the person under examination. In particular, the curved slice profiles can be generated by a standard gradient system having strongly linear gradient fields in combination with 1-channel, 2-channel or multichannel radio-frequency excitation. This provides an improved method for producing inflow-based angiographic MR images, which method images, reliably and without errors, vessel segments of a person under examination that do not run parallel to a coordinate axis of an MR system. The method thereby requires less time and personnel effort, and provides more accurate examination results at lower examination costs.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for producing angiographic magnetic resonance (MR) images of peripheral blood vessels based on unsaturated nuclear spins flowing into an imaging volume, wherein vessel segments of the peripheral blood vessels of a person under examination in an MR scanner do not run parallel to a coordinate axis of the MR scanner, said method comprising:
   operating the MR scanner so as to excite the magnetization of the nuclear spins in at least one imaging slice of the person under examination and to give said at least one imaging slice a parabolic slice profile, said parabolic slice profile being defined to allow a path of the vessel segments of the peripheral blood vessel to be as orthogonal as possible to the imaging slice, and thereby generating MR signals from said at least one slice that has said parabolic slice profile; and
   receiving the MR signals from the at least one imaging slice and producing angiographic MR images of the peripheral blood vessels from said MR signals.

2. The method as claimed in claim 1, comprising operating the MR scanner so as to excite the nuclear magnetization in the at least one imaging slice with a linear gradient system of the MR scanner, said linear gradient system having strongly linear gradient fields in all three spatial directions, in combination with 1-channel, 2-channel or multichannel radio-frequency excitation.

3. The method as claimed in claim 1, wherein the parabolic slice profile is mirror-symmetric with respect to a plane comprising the coordinate axis of the MR scanner.

4. The method as claimed in claim 1, comprising operating the MR scanner so as to make the parabolic slice profile run orthogonal to the coordinate axis of the MR scanner in a center of the imaging slice.

5. The method as claimed in claim 1, comprising operating the MR scanner so as to also give the parabolic slice profile a lateral angle, which includes a lateral course of the curved slice profile and the coordinate axis of the MR scanner.

6. The method as claimed in claim 5, wherein the lateral angle is in a range between 30 and 60 degrees.

7. The method as claimed in claim 6, wherein said lateral angle is 45 degrees.

8. The method as claimed in claim 1, comprising manually labeling regions of the person under examination and operating said scanner so as to produce said parabolic slice profile only in the regions of the person under examination that have been manually labeled.

9. The method as claimed in claim 1, comprising automatically labeling regions of the person under examination using tables comprising empirical patient data and operating said scanner so as to produce said parabolic slice profiles only in said regions of the person under examination that have been automatically labeled.

10. The method as claimed in claim 1, comprising using empirical patient data to optimize the parabolic slice profile.

11. The method as claimed in claim 1, comprising operating the MR scanner so as to also give the parabolic slice profile a lateral angle, which includes a lateral course of the parabolic slice profile and the coordinate axis of the MR scanner, and using empirical patient data to optimize said lateral angle.

12. The method as claimed in claim 1, wherein exciting the nuclear magnetization in at least one imaging slice comprises exciting the nuclear magnetization in a first imaging slice and in an additional, second imaging slice, which also has a parabolic slice profile.

13. The method as claimed in claim 12, comprising operating the MR scanner in order to make the first imaging slice and the second imaging slice at least partially overlap.

14. The method as claimed in claim 12, comprising operating the MR scanner in order to make the first imaging slice and the second imaging slice have different parabolic slice profiles.

15. The method as claimed in claim 1, comprising operating the MR scanner by using the quiescent interval single shot (QISS) method to generate the angiographic MR images.

16. A magnetic resonance apparatus comprising:
   a magnetic resonance data acquisition scanner;
   a computer configured to operate the magnetic resonance data acquisition scanner so as to acquire magnetic resonance angiographic data of peripheral blood vessels based on unsaturated nuclear spins flowing into an imaging volume of a person under examination, wherein vessel segments of the peripheral blood vessels of the person under examination do not run parallel to a coordinate axis of the magnetic resonance data acquisition scanner;
   said computer being configured to operate the magnetic resonance data acquisition scanner so as to excite the magnetization of the nuclear spins in at least one imaging slice of the person under examination wherein and to give said at least one imaging slice a parabolic slice profile, said parabolic slice profile being defined to allow a path of the vessel segments of the peripheral blood vessel to be as orthogonal as possible to the imaging slice, and thereby generating MR signals from said at least one slice that has said parabolic slice profile; and
   said computer being configured to receive the MR signals from the at least one imaging slice and producing angiographic MR images of the peripheral blood vessels from said MR signals.

17. A non-transitory, computer-readable data storage medium encoded with programming instructions, said storage medium being loaded into a control computer of a magnetic resonance apparatus, comprising a magnetic resonance data acquisition scanner, said programming instructions causing said control computer to:
   operate the magnetic resonance data acquisition scanner so as to acquire magnetic resonance angiographic data based on unsaturated nuclear spins flowing into an imaging volume of a person under examination, wherein peripheral blood vessels of the person under examination do not run parallel to a coordinate axis of the magnetic resonance data acquisition scanner;
   operate the magnetic resonance data acquisition scanner so as to excite the magnetization of the nuclear spins in at least one imaging slice of the person under examination wherein and to give said at least one imaging slice a parabolic slice profile, said parabolic slice profile being defined to allow a path of the vessel segments of the peripheral blood vessel to be as orthogonal as possible to the imaging slice, and thereby generating MR signals from said at least one slice that has said parabolic slice profile; and
   receive the MR signals from the at least one imaging slice and produce angiographic MR images of the peripheral blood vessels from said MR signals.

* * * * *